(12) United States Patent
Saito et al.

(10) Patent No.: US 6,645,876 B2
(45) Date of Patent: Nov. 11, 2003

(54) ETCHING FOR MANUFACTURE OF SEMICONDUCTOR DEVICES

(75) Inventors: Mami Saito, Yokohama (JP); Hiroshi Tomita, Yokohama (JP); Kunihiro Miyazaki, Yokohama (JP); Soichi Nadahara, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 10/014,609

(22) Filed: Dec. 14, 2001

(65) Prior Publication Data

US 2002/0086552 A1 Jul. 4, 2002

(30) Foreign Application Priority Data

Dec. 5, 2001 (JP) .................................... P2001-371746
Dec. 15, 2001 (JP) .................................... P2000-382221

(51) Int. Cl.$^7$ ............................................ H01L 21/302
(52) U.S. Cl. ...................................................... 438/745
(58) Field of Search ................................. 438/745, 757

(56) References Cited

U.S. PATENT DOCUMENTS 6,149,828 A * 11/2000 Vaartstra ..................... 216/57
6,245,640 B1 * 6/2001 Claussen et al. ............. 438/424
6,316,370 B1 * 11/2001 Mercaldi et al. ............. 438/745

FOREIGN PATENT DOCUMENTS

JP  11-135473   5/1999
JP  2000-164586  6/2000

OTHER PUBLICATIONS

Wolf, Silicon Processing for the VLSI Era, Lattice Press, vol. 1, pp. 516–516.*

* cited by examiner

Primary Examiner—David Nelms
Assistant Examiner—Quoc Hoang
(74) Attorney, Agent, or Firm—Finnegan, Henderson, Farabow, Garrett & Dunner, L.L.P.

(57) ABSTRACT

A method of manufacture of semiconductor devices is disclosed, which includes an etching process carried out by using an undiluted etching solution containing $H_2SO_4$ and $NH_4F$ or $H_2SO_4$ and HF as main components, and having an $H_2O$ content set to 5 wt % or lower. Moreover, a method of manufacture of semiconductor devices is disclosed, which includes selective etching an SiN film by using a mixed solution of $H_2SO_4$ and $H_2O$, or an etching solution obtained by adding a small amount of hydrofluoric acid to the mixed solution.

23 Claims, 15 Drawing Sheets

Table

|  |  | 1$^{st}$ embodiment, selective etching hard mask | 2$^{nd}$ embodiment, unselective etching SiN and SiO$_2$ |
|---|---|---|---|
| Etching condition | $H_2SO_4:H_2O=97:3$ <br> $NH_4F:10$mol/ℓ <br> (Undiluted etching solution) | $H_2SO_4:H_2O=97:3$ <br> $NH_4F:1$mol/ℓ | $H_2SO_4:H_2O=97:3$ <br> $NH_4F:0.5$mol/ℓ |
| Etching temperature |  | 10~100°C | 80~100°C |

|  | 3$^{rd}$ embodiment, removing residual reaction products after RIE | 4$^{th}$ embodiment, removing SiN | 5$^{th}$ embodiment, removing SiN |
|---|---|---|---|
| Etching condition | $H_2SO_4:H_2O=97:3$ <br> $NH_4F:0.02$~2mol/ℓ | $H_2SO_4:H_2O=70:30$ | $H_2SO_4:H_2O=70:30$ <br> +less than or equal to 0.1wt%HF added |
| Etching temperature | 10~100°C | 140~165°C | 100~180°C |

FIG.2

Table

| | | 1st embodiment, selective etching hard mask | 2nd embodiment, unselective etching SiN and $SiO_2$ |
|---|---|---|---|
| Etching condition | $H_2SO_4:H_2O=97:3$<br>$NH_4F:10mol/\ell$<br>(Undiluted etching solution) | $H_2SO_4:H_2O=97:3$<br>$NH_4F:1mol/\ell$ | $H_2SO_4:H_2O=97:3$<br>$NH_4F:0.5mol/\ell$ |
| Etching temperature | 10~100°C | 10~100°C | 80~100°C |

| | 3rd embodiment, removing residual reaction products after RIE | 4th embodiment, removing SiN | 5th embodiment, removing SiN |
|---|---|---|---|
| Etching condition | $H_2SO_4:H_2O=97:3$<br>$NH_4F:0.02~2mol/\ell$ | $H_2SO_4:H_2O=70:30$ | $H_2SO_4:H_2O=70:30$<br>+less than or equal to 0.1wt%HF added |
| Etching temperature | 10~100°C | 140~165°C | 100~180°C |

| etching solution | Si2P spectrum intensity | |
|---|---|---|
| | Si-N | Si-O |
| 60% $H_2SO_4$, 143°C | 93 | 7 |
| 68% $H_2SO_4$, 165°C | 76 | 24 |
| 75% $H_2SO_4$, 187°C | 9 | 91 |
| 85% $H_3PO_4$, 165°C | 93 | 7 |
| Ref.(HF treatment) | 94 | 6 |

FIG.18

| HF added concentration | etching rate | | etching selective rate |
|---|---|---|---|
| (wt%) | SiN(nm/min) | SiO$_2$(nm/min) | SiN/SiO$_2$ |
| 0.5 | 69.9 | 30.9 | 2.3 |
| 0.1 | 21.1 | 7.4 | 2.8 |
| 0.02 | 11.2 | 0.17 | 65.7 |
| 0.002 | 3.3 | 0.084 | 39.8 |

※ etching solution : (70wt%H$_2$SO$_4$+30wt%H$_2$O)+HF

ETCHING FOR MANUFACTURE OF SEMICONDUCTOR DEVICES

CROSS REFERENCE TO RELATED APPLICATION

This application is based upon and claims the benefit of priority from the prior Japanese Patent Applications No. 2000-382221 filed on Dec. 15, 2000 and No. 2001-371746 filed on Dec. 5, 2001, the entire contents of which are incorporated by reference herein.

BACKGROUND OF THE INVENTION

1. Field of the Invention

The present invention relates to etching for manufacture of semiconductor devices, more particularly, to etching for an insulating film such as an oxide film, a nitride film, or the like, and residual reaction products or the like after dry etching.

2. Description of the Related Art

In the manufacturing process of a semiconductor device, various films different from one another in a property are formed on a semiconductor substrate. Thus, for an etching process, an etching condition must be set according to a property of each film.

In addition, a plurality of films are normally laminated on the semiconductor substrate. In many cases, a plurality of films different from one another in a property are exposed to the surface of the substrate at the time of starting etching or during the etching process. In the etching process, there may be a case where only a specified one among the plurality of exposed films needs to be selectively etched, or a case where the plurality of films different from one another in a property need to be unselectively etched simultaneously.

For example, insulating films to be formed on the semiconductor substrate include a thermal oxide $SiO_2$ film obtained by thermal oxidation, a TEOS (tetra ethoxy silane) film obtained by a thermal CVD method, a TEOS film obtained by a plasma CVD method, a BPSG(boron phosphor silicate glass) film, a PSG(phosphor silicate glass) film and a BSG (boron silicate glass) film obtained by a CVD method, a SiN(silicon nitride) film and a SiON(silicon oxide nitride) film obtained by various CVD methods, and the like. Among these, a plurality of insulating films may be exposed to the surface of the semiconductor substrate. In a case, selective etching must be performed for only one of such insulating films. In another case, unselective etching must be performed for a plurality of insulating films.

Conventionally, chemical components have been selected to prepare an etching solution for each process depending on a property of a film to be etched or a required etching condition. Thus, various kinds of an etching solution have been used as such an etching solution, and etching apparatuses have respectively been used for individual cases.

For example, conventionally, in the case of etching for an oxide film, buffered hydrofluoric acid obtained by mixing a hydrofluoric acid (HF) solution with an ammonium fluoride solution, or an etching solution obtained by mixing a phosphoric acid solution with a hydrofluoric acid solution has been used. In addition, Japanese Patent Laid-Open publication P2000-164586 discloses the use of an etching solution obtained by mixing a hydrofluoric acid solution with inorganic acid such as acetic acid or the like, or a solution obtained by mixing a hydrofluoric acid solution with organic acid such as ethanol or the like, regarding selective etching carried out for a BSG film or a BPSG film with respect to a thermal oxide $SiO_2$ film.

An etching solution that has widely been used in a conventional case includes one containing phosphoric acid ($H_3PO_4$) in addition to the hydrofluoric acid solution, and the ammonium fluoride solution. For example, as a method of highly selectively etching SiN with respect to $SiO_2$, high-temperature etching of 160° C. using a mixed solution of phosphoric acid and water has been known. However, this method needs a dedicated apparatus for using $H_3PO_4$, and there is a high possibility of scattering of phosphorus (P) into a clean room atmosphere. Thus, an alternative process has been desired.

Furthermore, it has been reported that when a mixed solution of an organic material and acid is used as an etching solution for selective etching of a BSG film or a BPSG film with respect to a thermal oxide $SiO_2$ film, an etching temperature can be more lowered. However, the disposal of a waste solution of the organic material and the acid necessitates time and labor.

As described above, conventionally, chemical components have been selected to prepare an etching solution for each etching process depending on a property of a film to be etched or a required etching condition. Consequently, an etching apparatus has been necessary for each purpose, causing great burdens in terms of costs of chemical solutions and apparatuses, an occupied space in a manufacturing line, and chemical disposal after etching.

SUMMARY OF THE INVENTION

According to a first aspect of the present invention, a method of manufacture of semiconductor devices includes etching carried out by using a solution containing $H_2SO_4$ and $NH_4F$, alternatively $H_2SO_4$ and HF, as main components, and having an $H_2O$ content set to 5 wt % or lower as an undiluted etching solution.

According to a second aspect of the invention, a method of manufacture of semiconductor devices includes selective etching carried out for an SiN film with respect to one selected from an $SiO_2$ film, an Si substrate, and an Si film at an azeotropic point temperature, by using a mixed solution of $H_2SO_4$ and $H_2O$ having an azeotropic point set at 150° C. or higher as an etching solution.

According to a third aspect of the invention, a method of manufacture of semiconductor devices includes selective etching for an SiN film or an SiON film formed by a CVD method with respect to one selected from an $SiO_2$ film, an Si substrate, and an Si film at an etching solution temperature of 150° C. or higher, by using a mixed solution of $H_2SO_4$ and $H_2O$ having an $H_2O$ content set at 10 wt % to 40 wt % with respect to the $H_2SO_4$ as an etching solution.

According to a fourth aspect of the invention, a method of manufacture of semiconductor devices includes selective etching carried out for an SiN film or an SiON film formed by a CVD method with respect to one selected from an $SiO_2$ film, an Si substrate, and an Si film at an azeotropic point temperature, by using a solution obtained by adding HF of 0.1 wt % or lower to a mixed solution of $H_2SO_4$ and $H_2O$ having an azeotropic point set at 100° C. or higher as an etching solution.

According to a fifth aspect of the invention, a method of manufacture of semiconductor devices includes selective etching carried out for an SiN film or an SiON film formed by a CVD method with respect to one selected from an $SiO_2$ film, an Si substrate, and an Si film at an etching solution temperature of 120° C. or higher, by using a solution obtained by adding HF of 0.1 wt % or lower to a mixed solution of $H_2SO_4$ and $H_2O$ having an $H_2O$ content set at 10 wt % to 50 wt % with respect to the $H_2SO_4$.

According to a sixth aspect of the invention, a method of manufacture of semiconductor devices includes selectively etching a specific one or a plurality of insulating films among a plurality of films different from one another in a property, and exposed to a surface of a semiconductor substrate, with respect to another film, by using a first etching solution. The first etching solution is an undiluted etching solution containing $H_2SO_4$ and $NH_4F$, or $H_2SO_4$ and HF as main components, and having an $H_2O$ content set to 5 wt % or lower, alternatively a solution obtained by diluting the undiluted etching solution by a sulfuric acid solution having an $H_2O$ content set at 5 wt % or lower. The method also includes another selectively etching a specific one or a plurality of insulating films among a plurality of films different from one another in a property, and exposed to the surface of the semiconductor substrate by using a second etching solution. The second etching solution is the undiluted etching solution, alternatively a solution obtained by diluting the undiluted etching solution by the sulfuric acid solution having the $H_2O$ content set at 5 wt % or lower. Furthermore the method includes unselective etching a plurality of insulating films exposed to the surface of the semiconductor substrate by using a third etching solution. The third etching solution is the undiluted etching solution, alternatively a solution obtained by diluting the undiluted etching solution by the sulfuric acid solution having the $H_2O$ content set at 5 wt % or lower.

According to a seventh aspect of the invention, a method of manufacture of semiconductor devices includes etching an insulating film exposed to a surface of a semiconductor substrate by using an etching solution. The etching solution is an undiluted etching solution containing $H_2SO_4$ and $NH_4F$, alternatively $H_2SO_4$ and HF as main components, and having an $H_2O$ content set to 5 wt % or lower, alternatively a solution obtained by diluting the undiluted etching solution by sulfuric acid solution having an $H_2O$ content set at 5 wt % or lower. The method also includes subjecting the surface of the semiconductor substrate after the etching step to preliminary cleaning by a sulfuric acid solution having an $H_2O$ content set at 5 wt % or lower. Furthermore the method includes subjecting the surface of the semiconductor substrate after the preliminary cleaning to real cleaning by pure water.

BRIEF DESCRIPTION OF THE DRAWINGS

FIG. 2 is a table showing an undiluted etching solution and etching conditions used for the respective embodiments.

FIG. 18 is a table showing added HF concentration, an etching rate and an etching selective rate when HF is added to the etching solution of the fourth embodiment of the invention.

DETAILED DESCRIPTION OF THE EMBODIMENTS

The inventors of the present application have conducted studies on various etching necessary for manufacturing semiconductor devices. As a result of the studies, it has been found that the presence of water ($H_2O$) is extremely important for selective etching of an insulating film, and a selective rate tends to be lowered when the amount of $H_2O$ contained in an etching solution is increased. With regard to unselective etching, similarly, it has been found that as in the case of the selective etching, the adjustment of the amount of $H_2O$ is important. Because a predetermined unselective etching cannot be performed when there is an excessive amount of $H_2O$ in the etching solution.

However, with regard to hydrofluoric acid and ammonium fluoride used for general etching solution of an insulating film, commercial chemical types have been used. As these types contain much water even in the case of one of the highest concentration, it has been difficult to adjust an $H_2O$ content to a low concentration.

On the other hand, the inventors of the present application have found an undiluted etching solution, which enables water content to be adjusted within a low concentration by dilution, and which can be used in common in a plurality of etching processes, and an etching method using this undiluted etching solution. In addition, the inventors have found an etching solution, which has composition similar to that of the above undiluted etching solution, and enables an etching apparatus, waste solution disposal, and the like, to be shared with the other etching processes. Hereinafter, the preferred embodiments of the invention will be described.

(Undiluted Etching Solution)

Figure 1:
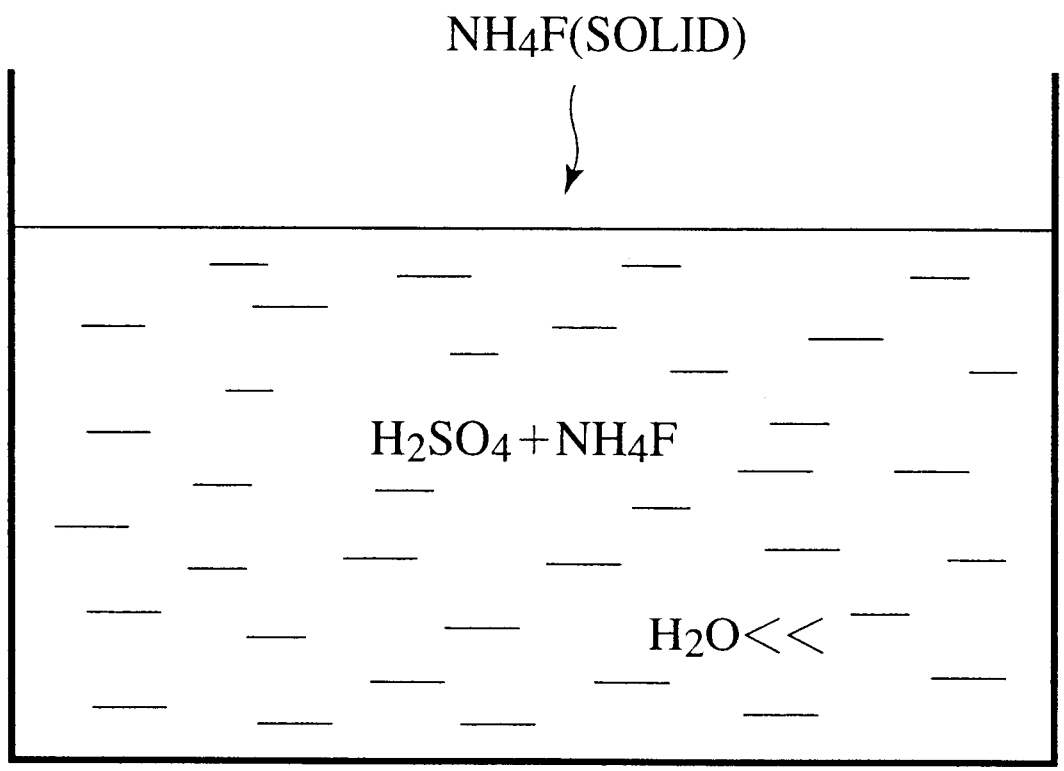
FIG. 1 is a view showing composition of an undiluted etching solution used for each of first to third embodiments of the present invention.

FIG. 1 is a conceptual view showing the composition of an undiluted etching solution used in common in etching operations of the first to third embodiments described below. The undiluted etching solution is used directly or after being diluted.

As shown in FIG. 1, the main components of the undiluted etching solution are sulfuric acid ($H_2SO_4$) and ammonium fluoride salt ($NH_4F$), limiting the content of inevitably contained water ($H_2O$) to a low concentration.

This undiluted etching solution is prepared by dissolving solid ammonium fluoride ($NH_4F$) with respect to 1 liter of commercial sulfuric acid solution. For example, about 0.1 to 20 mol/liter is dissolved with respect to the sulfuric acid solution. In other words, $NH_4F$ of 0.2 wt % or more is added to the sulfuric acid solution. The solid $NH_4F$ contains almost no water different from the case of an ammonium fluoride solution widely used for an etching solution conventionally, the content of water inevitably contained in the undiluted etching solution can be greatly reduced.

In addition, for the sulfuric acid solution, one of a water ($H_2O$) content set as small as possible is used. For example, one having an $H_2O$ content of 4 wt % or lower is used. Accordingly, it is possible to use a commercial sulfuric acid solution of a concentration of 98 wt % to 96 wt %, which contains $H_2O$ of 2 wt % to 4 wt %.

For optimal etching conditions used in the first to third embodiments described below, a sulfuric acid solution having a weight concentration ratio between $H_2SO_4$ and $H_2O$ set at 97:3 is used, and one obtained by dissolving a 10 mol equivalent (about 370 g) of solid ammonium fluoride in the sulfuric acid solution is used as an undiluted etching solution. A weight concentration ratio among $H_2SO_4$, $NH_4F$ and $H_2O$ of this undiluted etching solution is to about 97:20:3.

For dilution of the above undiluted etching solution, as in the case of the sulfuric acid solution used in the undiluted etching solution, a sulfuric acid solution having a weight concentration ratio between $H_2SO$ and $H_2O$ set at 97:3 is added.

The table of FIG. 2 shows an undiluted etching solution, the composition of the etching solution used in each later-described embodiment, and an etching temperature condition.

(Other Examples of Undiluted Etching Solutions)

The foregoing undiluted etching solution was prepared by adding the solid material of ammonium fluoride ($NH_4F$) to a sulfuric acid solution having the $H_2O$ content of 4 wt % or lower. However, chemicals to be added to the sulfuric acid solution are not limited to ammonium fluoride. Any chemicals that can mix an $NH_4F$ or HF component in the sulfuric acid solution not accompanied with water can be used in place of the ammonium fluoride.

For example, ammonium hydrogen fluoride ($NH_4F \cdot HF$) can be obtained in the form of a solid material as in the case of the ammonium fluoride. Accordingly, by dissolving it in the solid form in sulfuric acid, an undiluted etching solution having a small water content can be prepared. Ammonium hydrogen fluoride provides an advantage of reducing material costs more, as it is cheaper than ammonium fluoride.

Figure 3:
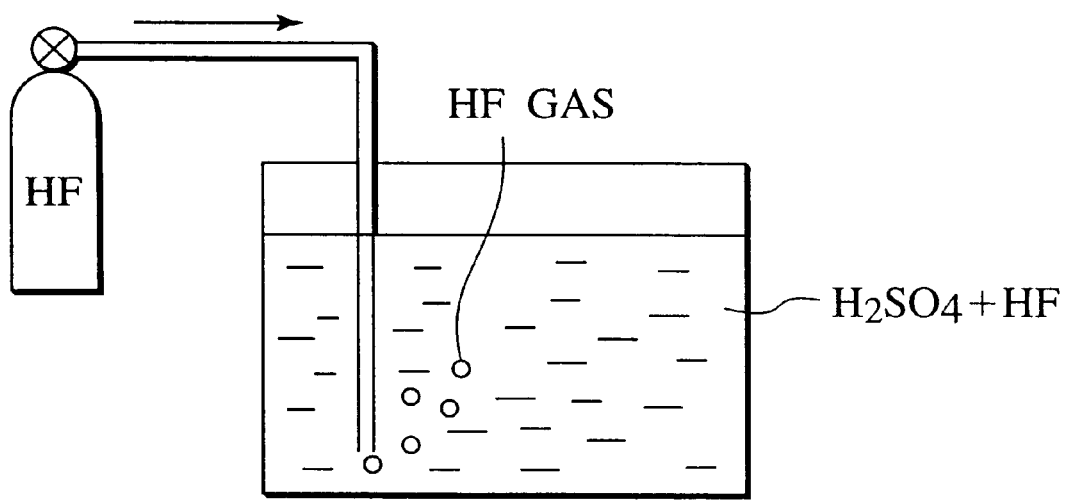
FIG. 3 is a view showing a producing method of another undiluted etching solution using mono HF gas.

In addition, the use of mono HF gas as a material to be added to sulfuric acid is advantageous. Generally, hydrofluoric acid (HF) used for an etching solution is in the form of an aqueous solution, which cannot remove a great deal of water. As shown in FIG. 3, however, HF can be introduced from a mono HF gas cylinder by using a bubbling method not accompanied by water into the sulfuric acid solution. In particular, as a boiling point of mono HF is as low as 19° C., it can be easily gasified. As a method of introducing HF, an ejector as an apparatus for mixing gas with liquid may be used.

Furthermore, a hydrofluoric acid anhydride solution can also be used. An undiluted etching solution may be prepared by maintaining the hydrofluoric acid anhydride solution in a liquid form at 19° C. or lower, and mixing the hydrofluoric acid anhydride solution with the sulfuric acid solution. Thus, when the undiluted etching solution is prepared by mixing one solution with another, the necessity of bubbling or stirring is eliminated. Accordingly, the preparation of the undiluted etching solution can be facilitated. Note that the hydrofluoric acid anhydride may be vaporized, and dissolved in the sulfuric acid solution by using the bubbling method shown in FIG. 3.

Note that, as described above, if for example, high purity sulfuric acid having a water content of 2 wt % or lower, e.g., sulfuric acid of 98 wt %, can be used for the sulfuric acid solution in place of one hardly containing water as the HF material, an undiluted etching solution can be prepared by mixing this solution with a commercial hydrofluoric acid solution containing moisture of about 50%, an ammonium fluoride solution or the like. In other words, the undiluted etching solution should contain $H_2SO_4$ and $NH_4F$, or $H_2SO_4$ and HF as main components, and $H_2O$ in the solution should be set to 5 wt % or lower.

(First Embodiment)

Next, description will be made for selective etching carried out for an insulating film by using the foregoing undiluted etching solution according to the first embodiment.

Figure 4A:
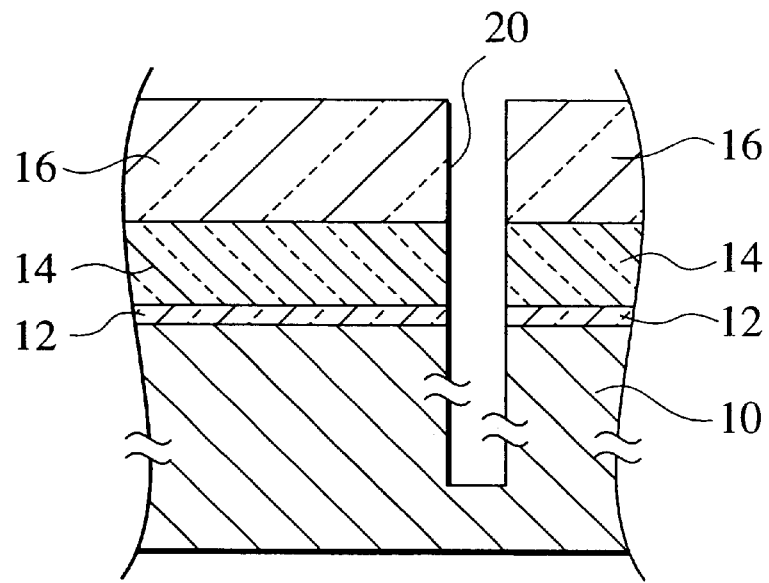
FIGS. 4A and 4B are sectional views respectively showing semiconductor devices before and after etching in an etching example of the first embodiment of the present invention.
Figure 4B:
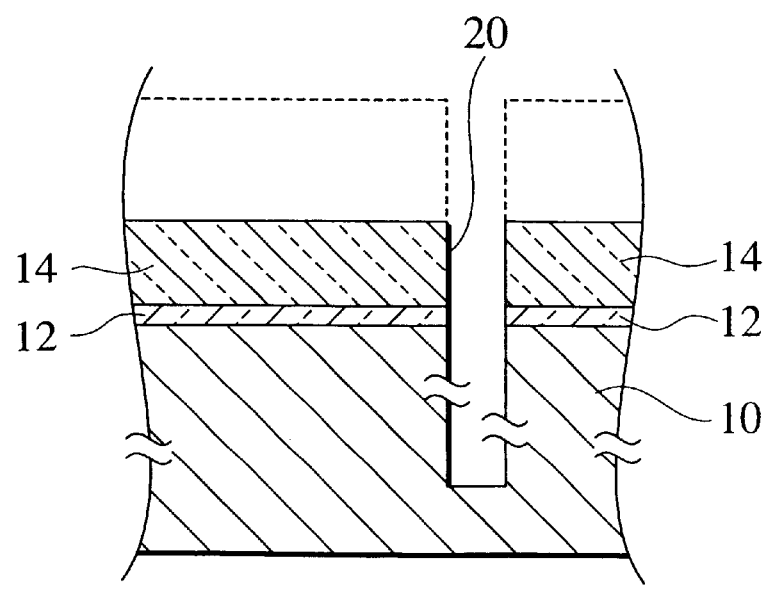

Each of FIGS. 4A and 4B is a partial sectional view of a semiconductor device showing the etching of the first embodiment. For example, as shown in FIG. 4A, there are laminated a thermal oxide $SiO_2$ film 12, an SiN film 14, and a BSG film 16 formed on an Si substrate 10 by thermal oxidation. Using the BSG film 16 as a hard mask (etching mask), a trench 20 is formed by a reactive ion etching (RIE) method. Then, as shown in FIG. 4B, selective etching is carried out only for the uppermost BSG film 16 used as a hard mask. This is the etching of the first embodiment.

Each layer is exposed to the inner wall of the trench 20. In other words, in this etching, the BSG film 16 must be selectively etched with respect to the other exposed layers, i.e., the SiN film 14, and the thermal oxide film $SiO_2$ film 12, and the Si substrate 10. A particular problem arising in this case is etching selectivity of the BSG film with respect to the thermal oxide $SiO_2$ film 12 having similar film composition.

Figure 5:
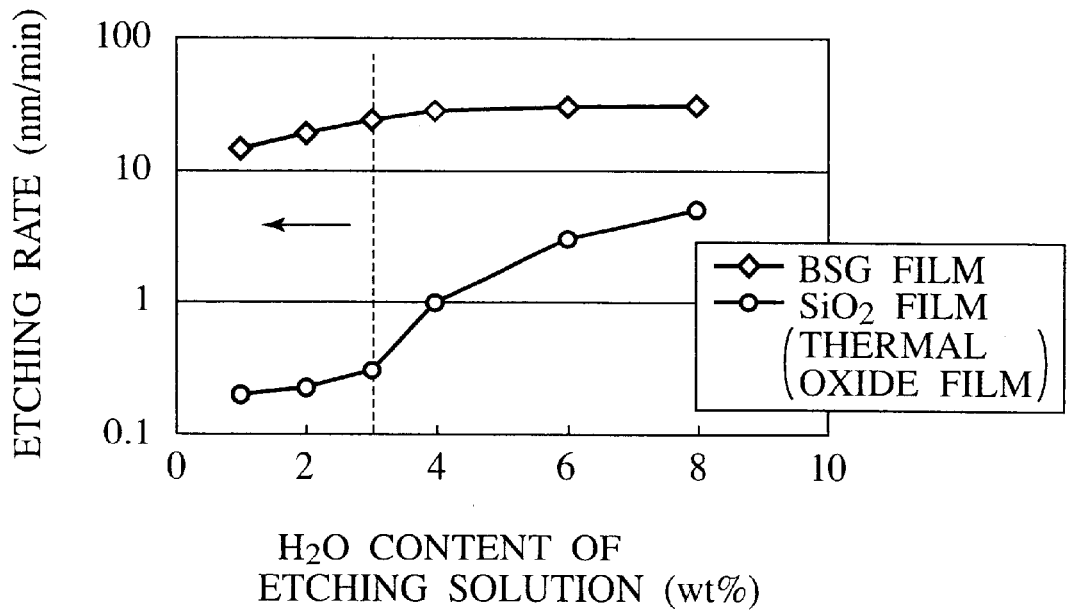
FIG. 5 is a graph showing a relation of etching rates of a BSG film and a thermal oxide $SiO_2$ film with an $H_2O$ content in an etching solution.

FIG. 5 is a graph showing the respective etching rates of the BSG film 16 and the thermal oxide $SiO_2$ film 12 with respect to changes in the water content of the etching solution, the used etching solution having been prepared by fixing the amount of $NH_4F$ added into a sulfuric acid solution at 1 mol/liter, and changing the water content of the sulfuric acid solution from 1 wt % to 8 wt %.

As shown in FIG. 5, when the $H_2O$ content in the sulfuric acid solution is gradually reduced from 8 wt % to 1 wt %, almost no changes occur in the etching rate of the BSG film. However, the etching rate of the thermal oxide $SiO_2$ film is gradually reduced following the decrease of the $H_2O$ content. In particular, the etching rate is remarkably lowered at 4 wt % or lower. In other words, the lower the $H_2O$ content in the etching solution is, the higher the etching selectivity can be obtained for the BSG film with respect to the thermal oxide $SiO_2$ film. More specifically, if the $H_2O$ content in the sulfuric acid solution used for the etching solution is 5 wt % or lower, preferably 3 wt % or lower (the left region of the broken line in FIG. 5), the BSG film can be etched with respect to the thermal oxide $SiO_2$ film by a high selective rate.

The etching solution having the $H_2O$ content in the sulfuric acid solution set at 3 wt %, shown in FIG. 5, can be easily obtained by diluting 10 times the undiluted etching solution shown in the table of the foregoing FIG. 2 (the undiluted etching solution prepared by dissolving 10 mol/liter of $NH_4F$ in the sulfuric acid solution having the weight concentration ratio of $H_2SO_4$ and $H_2O$ set at 97:3) with a sulfuric acid solution having a weight concentration ratio between $H_2SO_4$ and $H_2O$ set at 97:3.

The BSG film used as the hard mask generally has a thick film thickness. Thus, a low etching rate is not preferable for process efficiency, because etching time is prolonged. Therefore, a high etching rate to some extent is desired.

Figure 6:
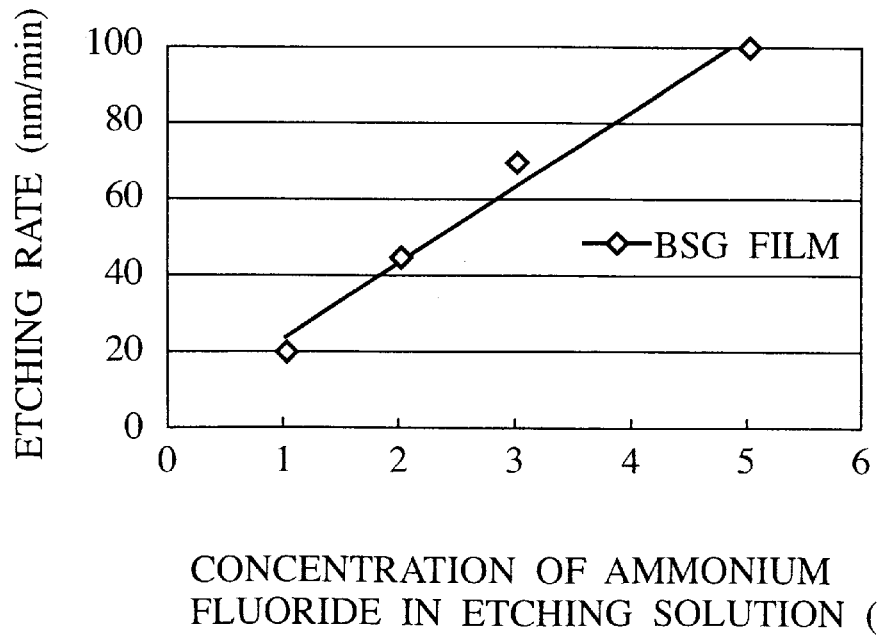
FIG. 6 is a graph showing ammonium fluoride concentration in the etching solution and the etching rate of the BSG film.

FIG. 6 is a graph showing changes in the etching rate of the BSG film when a weight concentration ratio between $H_2SO_4$ and $H_2O$ in the etching solution is fixed at 98:2, and the concentration of ammonium fluoride ($NH_4F$) in the etching solution is changed. As apparent from FIG. 6, the higher the $NH_4F$ concentration in the etching solution is, the higher the etching rate of the BSG film is. Thus, based on the graph of FIG. 6, a practically desired condition is that the $NH_4F$ concentration in the etching solution is set to 1 mol/liter or higher. For example, for such an etching solution, the undiluted etching solution shown in the table of FIG. 2 only needs to be diluted with a sulfuric acid solution having a weight concentration ratio between $H_2SO_4$ and $H_2O$ set at 97:3 by 20 times or lower, more preferably 10 times or lower.

With regard to an etching temperature, processing can be carried out at a low temperature as low as about 10° C., at room temperature, or at a high temperature of 200° C. according to the thickness of a film to be etched or permitted process time. However, especially in processing where in-plane uniformity of etching is a problem, if stirring functions are not equipped in the etching tank, processing should preferably be carried out at, for example, 50° C. or higher where the viscosity of $H_2SO_4$ is lowered. In this case, very high in-plane uniformity can be obtained in batch processing.

However, in the etching apparatus to be used, if the etching tank provided with a sufficient stirring function is used, sufficient in-plane uniformity can be obtained even around 10° C. On the other hand, considering scattering from the chemical solution of contained $NH_4F$, etching should preferably be carried out at 80° C. or lower. Accordingly, desired processing is one carried out at room temperature, which needs no extra power from a heater, a fan or the like.

Therefore, temperature control and control of $H_2O$ and $NH_4F$ contents in the sulfuric acid solution enable the BSG film to be etched with a very high selective rate with respect to the thermal oxide $SiO_2$ film. Needless to say, the etching solution used for processing can be repeatedly used many times.

In the foregoing, the example of selective etching for the BSG film was described. By using an etching solution obtained by diluting the same undiluted etching solution with a sulfuric acid solution having a water content of 5 wt % or lower, selective etching can also be carried out for the PSG film, the BPSG film, the TEOS film formed by a low pressure CVD method, and the like, which are used as hard masks other than the above, with respect to the thermal oxide $SiO_2$ film or an SiON film formed by a CVD method. These hard mask materials can also be selectively etched with respect to the SiN film, the Si film or other conductive films (metal) or the like. Moreover, the TEOS film formed by the low pressure CVD method can be selectively etched with respect to a TEOS film formed by a plasma CVD method.

Furthermore, the SiN film and the TEOS film formed by the plasma CVD method can be selectively etched with respect to the Si film or the Si substrate. The number of films for selective etching is not limited to one, but a plurality of films can be simultaneously etched with respect to other films. Note that, if a resist is present on the surface of the substrate, the resist can be removed simultaneously with the hard mask selective etching.

(Second Embodiment)

Next, description will be made for unselective etching carried out for an insulating film by using the foregoing undiluted etching solution according to the second embodiment.

Figure 7A:
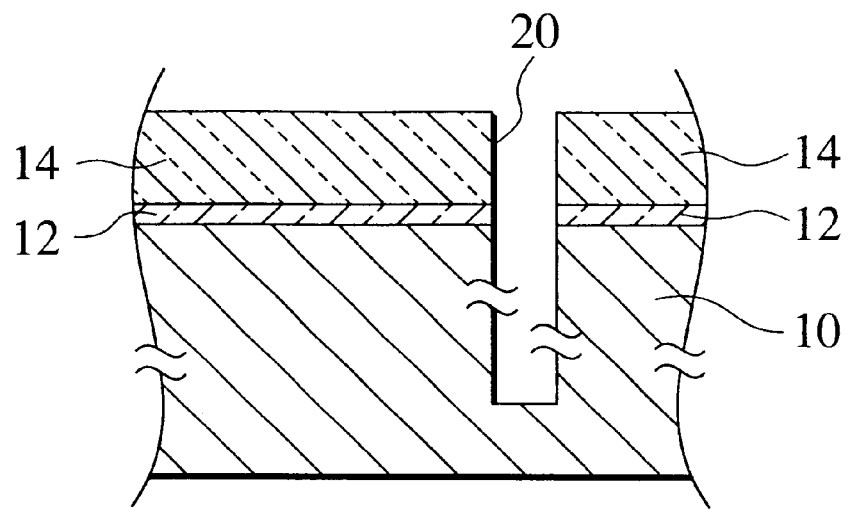
FIGS. 7A and 7B are sectional views respectively showing semiconductor devices before and after etching in an etching example of the second embodiment of the present invention.
Figure 7B:
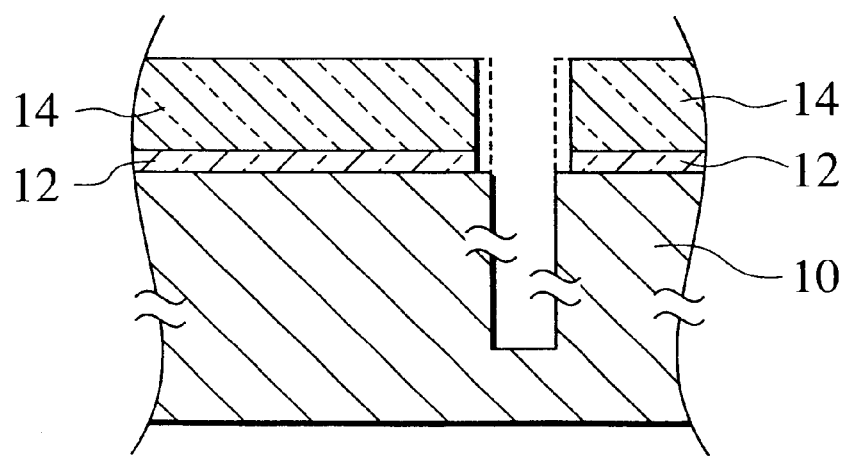

Each of FIGS. 7A and 7B is a partial sectional view of a semiconductor device showing the etching of the second embodiment. For example, as shown in FIG. 7A, there are laminated a thermal oxide $SiO_2$ film 12 and an SiN film 14 formed on an Si substrate 10 by a thermal oxidation method. If a trench 20 is formed, where each layer is exposed to the inner wall surface, as shown in FIG. 7B, the SiN film 14 and the thermal oxide $SiO_2$ film 12 are etched by about 10 nm to remove irregular portions and to make the surface smoother. This is the process, to which the etching of the second embodiment is applied. In other words, this is a process carried out after the etching of the BSG film as the hard mask of the first embodiment. In this case, the SiN film 14 and the thermal oxide $SiO_2$ film 12 must be etched unselectively, for example, in such a way as to set the etching rate of the SiN film 14 higher by about 1 to 1.5 times than the etching rate of the thermal oxide $SiO_2$ film 12.

Figure 8:
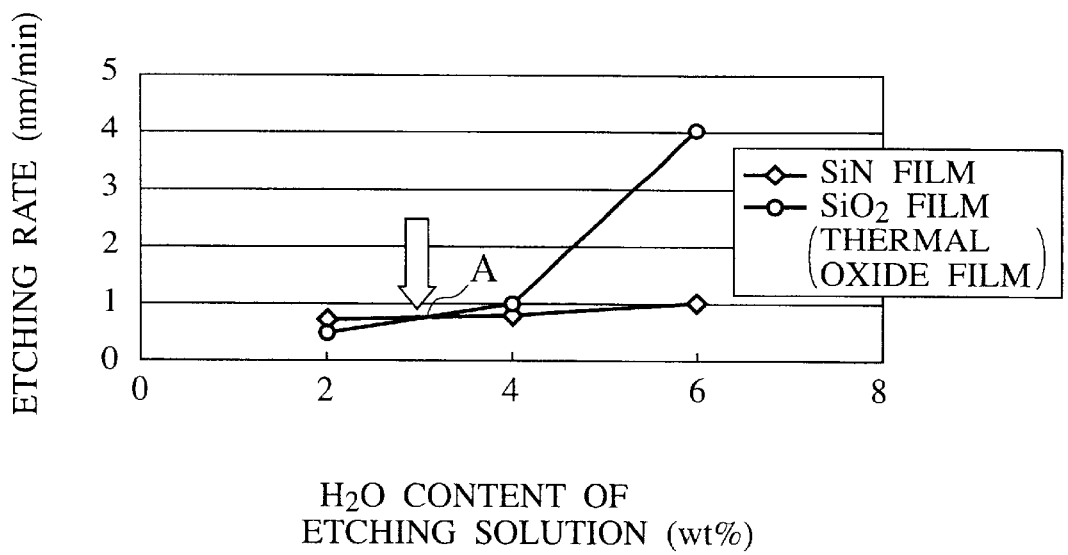
FIG. 8 is a graph showing a relation of etching rates of an SiN film and a thermal oxide $SiO_2$ film with an $H_2O$ content in an etching solution.

FIG. 8 is a graph showing the respective etching rates of the SiN film 14 and the thermal oxide $SiO_2$ film 12 with respect to changes in the water content of an etching solution, the used etching solution having been prepared by fixing the amount of $NH_4F$ added into a sulfuric acid solution at 0.5 mol/liter, and changing the water content of the sulfuric acid solution from 1 wt % to 6 wt %. Note that an etching temperature was set at 100° C.

As shown in FIG. 8, when $H_2O$ content of the etching solution is high, the etching rate of the thermal oxide $SiO_2$ film is higher than that of the SiN film. However, when the $H_2O$ content is lowered to a certain level or more, the etching rates are reversed ("A" point in FIG. 8). Thus, by carrying out etching under an etching condition near the intersection ("A" point in FIG. 8) of both etching rates, substantially both of the SiN film and the thermal oxide $SiO_2$ film can be etched unselectively.

For example, to increase the etching rate of the thermal oxide $SiO_2$ film more than that of the SiN film by about 1 to 1.5 times, an etching solution only needs to be used, which is obtained by diluting about 2 to 50 times, the undiluted etching solution shown in FIG. 2 (the undiluted etching solution prepared by dissolving 10 mol/liter of $NH_4F$ in the sulfuric acid solution having the weight concentration ratio of $H_2SO_4$ and $H_2O$ set at 97:3) with a sulfuric acid solution having composition similar to that of the sulfuric acid solution in the undiluted etching solution.

A dilution ratio of the undiluted etching solution is decided based on a relation with an etching temperature. For example, when an etching temperature is set at 80° C., an etching solution diluted by about 10 times may be used. To carry out etching at a temperature higher than 100° C., a more diluted etching solution can be used because an etching rate is increased.

The etching temperature range should be preferably set at 50° or higher considering uniformity, and at 100° C. or lower considering chemical stability. Since an etching rate is low at 50° C., a desired range may be from 80° C. to 100° C. To carry out etching at a temperature exceeding 80° C., since $NH_4F$ scattering occurs, an undiluted etching solution must be supplied according to the scattering amount thereof.

(Third Embodiment)

Next, description will be made for a condition for removing residual reaction products after reactive ion etching (RIE) using the foregoing undiluted etching solution according to the third embodiment.

Figure 9A:
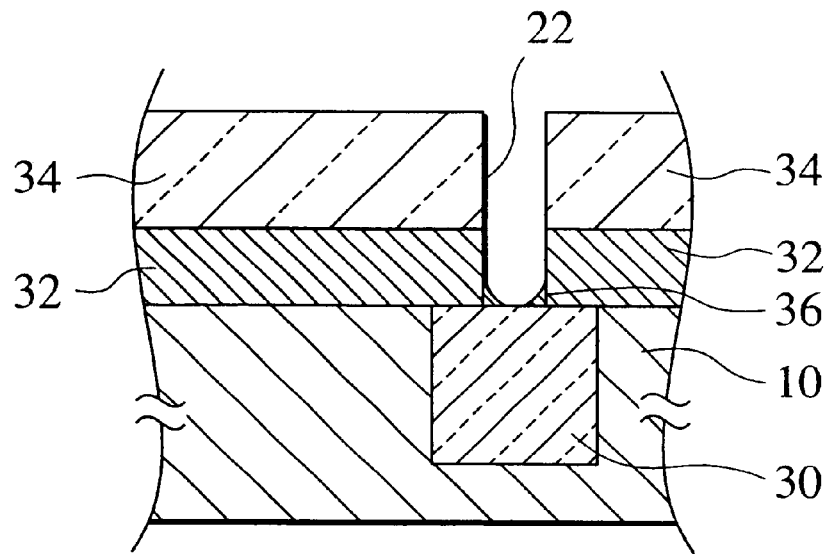
FIGS. 9A and 9B are sectional views of semiconductor devices before and after removing reaction products in dry etching of an etching example of the third embodiment of the present invention.
Figure 9B:
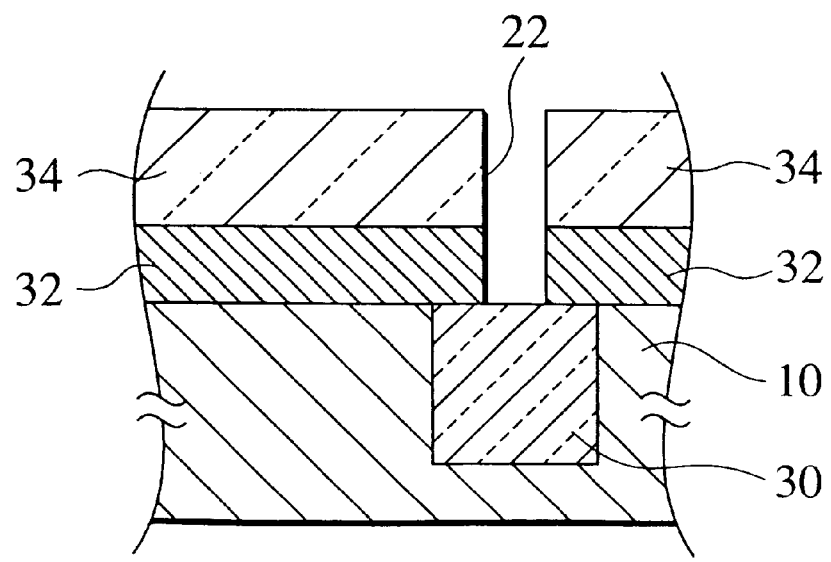

Each of FIGS. 9A and 9B is a partial sectional view of a semiconductor device showing the etching of the third embodiment. For example, as shown in FIG. 9A, there are laminated a polysilicon film 32 and a BSG film 34 on an Si substrate 10 including a shallow trench isolation layer (STI) 30 as a buried element isolation region. A trench 22 having the STI layer 30 exposed to the bottom surface is formed by the RIE method, and then a residual reaction products 36 of dry etching left in the bottom of the trench 22 is removed as shown in FIG. 9B. This is the etching of the third embodiment.

The residual reaction products 36 left in the corners of the bottom of the trench are rough deposits. In particular, the residual reaction products 36 left after the RIE of the polysilicon film 32 are very rough films, and thus it can be dissolved and removed by a weak hydrofluoric acid solution. However, the use of such a weak diluted hydrofluoric acid solution for the removal of the residual reaction products 36 is not preferable, because the $SiO_2$ film of the STI layer 30 exposed to the bottom surface of the trench 22 is also etched. Thus, a condition must be set for selectively etching the residual reaction products 36 with respect to the STI layer 30.

Figure 10:
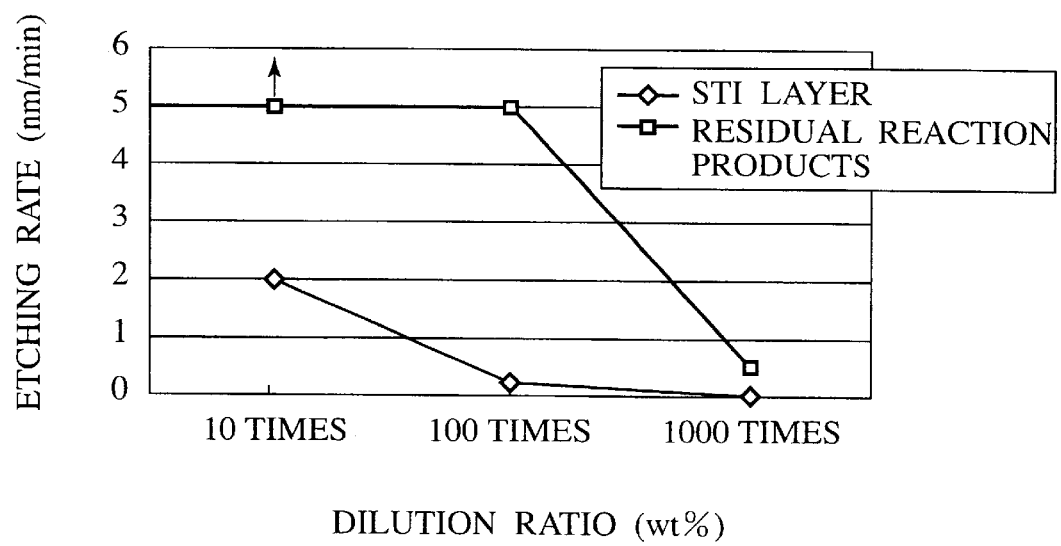
FIG. 10 is a graph showing a relation of etching rates of an STI layer and a dry etching residual reaction products with a dilution ratio of an undiluted etching solution.

FIG. 10 is a graph showing the respective etching rates of the STI layer and the residual reaction products 36 of dry etching with respect to dilution ratios, in which the undiluted etching solution shown in the foregoing FIG. 2 is diluted by a sulfuric acid solution having a weight concentration ratio between $H_2SO_4$ and $H_2O$ set at 97:3.

As can be understood from FIG. 10, by using an etching solution obtained by diluting the undiluted etching solution by 10 to 1000 times, the residual reaction products can be selectively etched with respect to the STI layer. When the etching solution diluted by 10 times is used, the residual reaction products are etched within 1 min. When the etching solution diluted by 100 times is used, the residual reaction products can be removed by a high selective rate with respect to the STI layer. Moreover, when the dilution ratio of the etching solution is increased 1000 times, the etching rate of the residual reaction products are lowered, necessitating etching for about 10 min.

Thus, in the case of using a single wafer etching apparatus, as it is desired to finish the processing of single wafer within 1 min., one obtained by diluting the undiluted etching solution by about 10 to 100 times should preferably be used as an etching solution. On the other hand, in the case of using a batch processing etching apparatus, one obtained by diluting the undiluted etching solution by about 100 to 1000 times should preferably be used as an etching solution. In addition, an etching temperature can be set within the range of 10° C. to 100° C. However, processing should preferably be carried out at room temperature, where no extra power of a heater, a fan or the like is necessary.

Furthermore, by using the foregoing etching solution, selective etching can be carried out for any residual reaction products after dry etching, irrespective of the type of a film to be dry-etched or the type of etching gas.

(Fourth Embodiment)

Next, description will be made for the removing process (etching process) of the SiN film according to the fourth embodiment.

Figure 11A:
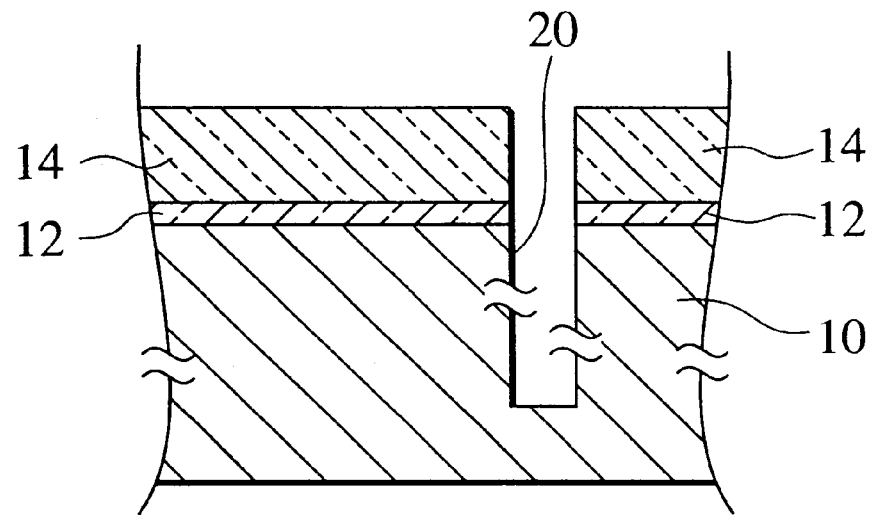
FIGS. 11A and 11B are sectional views showing semiconductor devices before and after etching in an etching example of the fourth embodiment of the present invention.
Figure 11B:
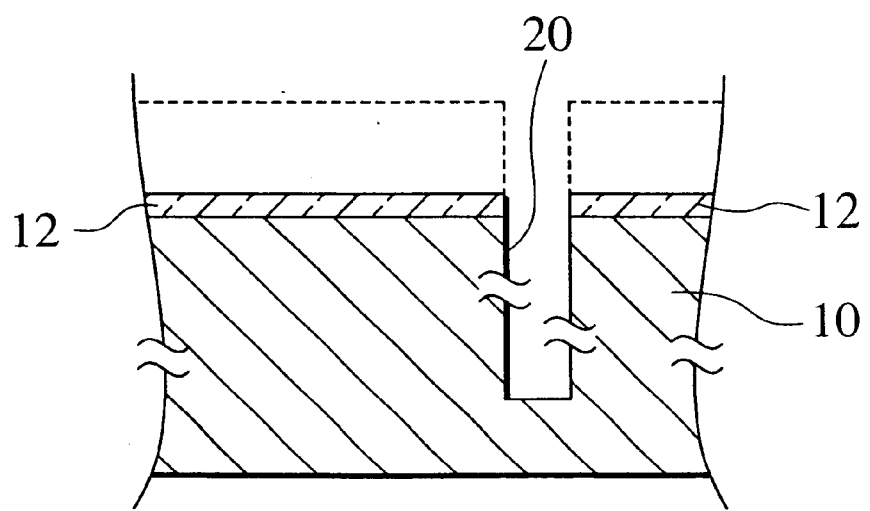

Each of FIGS. 11A and 11B is a partial sectional view of a semiconductor device showing the etching of the fourth embodiment. For example, as shown in FIG. 11A, there are laminated a thermal oxide $SiO_2$ film 12, and an SiN film 14 on an Si substrate 10, and the SiN film 14 is selectively etched. This is the etching of the fourth embodiment. To remove the SiN film 14 after the etching process of the first embodiment, since the trench 20 is formed in the Si substrate 10, and the Si substrate 10 and the thermal oxide $SiO_2$ film 12 are exposed to the inner surface of the trench 20, the SiN film 14 must be selectively etched with respect to these films.

Figure 12:
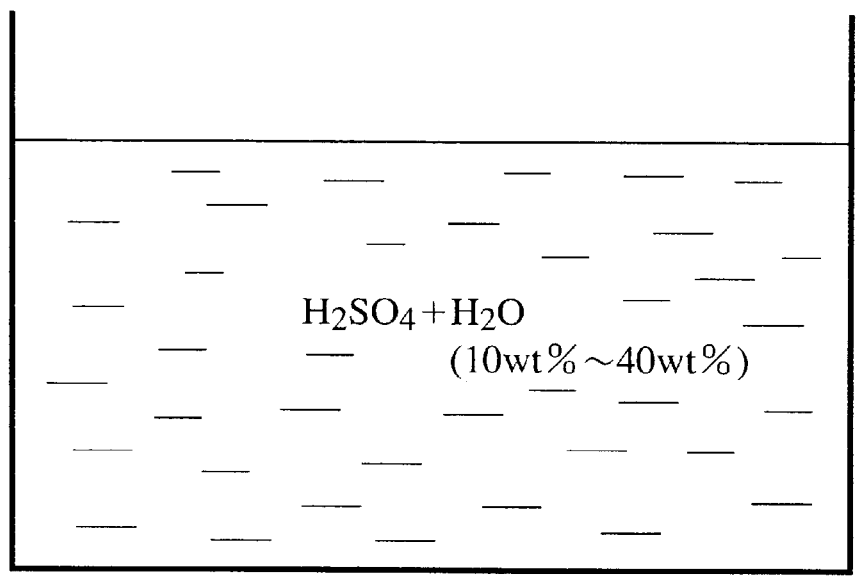
FIG. 12 is a view showing composition of an etching solution used for the fourth embodiment of the present invention.

FIG. 12 shows the composition of the etching solution used in the removing process of the SiN film according to the fourth embodiment. This etching solution is obtained by mixing $H_2SO_4$ with $H_2O$. These components are also contained in the undiluted etching solution shown in the table of the foregoing FIG. 2.

In the process of removing the SiN film, the SiN film 14 must be selectively etched with respect to the $SiO_2$ film 12. However, when hydrofluoric acid or ammonium fluoride is contained in the etching solution, the $SiO_2$ film is etched. Thus, the undiluted etching solution or the diluted solution thereof used in the first to third embodiments cannot be directly used.

Conventionally, the removing of the SiN film has been carried out by using a phosphoric acid ($H_3PO_4$) aqueous solution. It is said that the mechanism of removing the SiN film by this $H_3PO_4$ aqueous solution is etching by high-temperature $H_2O$ following the increase of a boiling point of $H_2O$ brought about by a mixed solution. This high-temperature $H_2O$ is obtained as a result of a boiling point increase caused by mixing with $H_3PO_4$. According to this conventional removing method, the SiN film can be selectively removed. However, since the use of $H_3PO_4$ necessitates a dedicated apparatus, and phosphorus (P) is apt to be scattered in a clean room, an alternative process has been desired.

On the other hand, a boiling point of $H_2SO_4$, which is contained as a common component in this etching solution and the etching solution used in each of the first to third embodiments, is 300° C. or higher. However, for example, if 30 wt % of $H_2O$ is contained, an azeotropic point of 160° C. or higher can be obtained. Accordingly, the inventors of the present application examined the etching solution for removing the SiN film using $H_2SO_4$ instead of the conventional $H_3PO_4$ in the SiN film removing process. As a result, the following was found, that is, as shown in FIG. 12, the mixed solution of $H_2SO_4$ and $H_2O$ containing 10 wt % to 40 wt % of $H_2O$ can be used as the etching solution for removing the SiN film.

Figure 13:
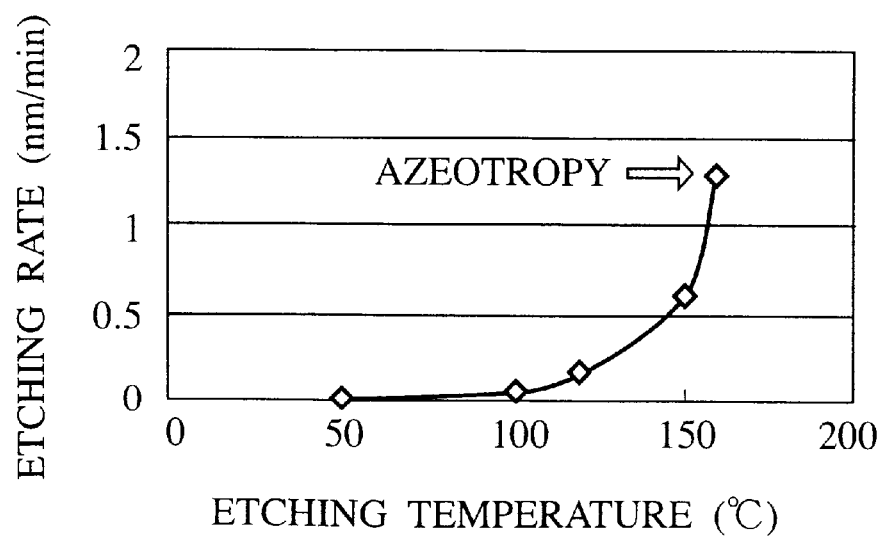
FIG. 13 is a graph showing a relation of an etching rate of an SiN film with an etching solution temperature in the fourth embodiment of the present invention.

FIG. 13 is a graph showing a relation between an etching temperature and an etching rate when the SiN film is removed by using a mixed solution having a mixed weight ratio of $H_2SO_4$ and $H_2O$ set at 70 wt %: 30 wt %. As shown in the graph, etching rate is increasing from around the time when an etching temperature exceeds 120° C., then exceeding 150° C., and near 160° C., an azeotropic state is set, thus exhibiting a steep increase in the etching rate. In other words, in the case of using the mixed solution having the ratio of $H_2SO_4$ and $H_2O$ set at 70 wt %: 30 wt %, the SiN film can be removed under the condition of a mixed solution temperature of 150° C. or higher. A more preferable temperature is 160° C., which is an azeotropic point, because the SiN film can be removed more effectively around this temperature.

Therefore, if the process for removing the SiN film can be carried out by using the mixed solution of $H_2SO_4$ and $H_2O$, since this mixed solution has composition similar to that of the etching solution used in each of the first to third embodiments, or composition similar to that of its diluted solution, the etching apparatus used in each of the first to third embodiments and the etching apparatus used in the fourth embodiment can be partially shared. In addition, waste solution disposal can be carried out in common, providing advantages of increasing process efficiency and reducing apparatus costs.

At the azeotropic point, mainly $H_2O$ is scattered, causing a change in a solution concentration. Accordingly, a processing temperature should preferably be maintained by, for example, adding $H_2O$ little by little at a point of time when the temperature is increased while monitoring the temperature.

The mixing ratio of $H_2SO_4$ and $H_2O$ is not limited to the foregoing 70 wt %: 30 wt %. For example, the $H_2O$ content can be reduced more, and the azeotropic point temperature can be set to 200° C. or higher. On the other hand, if the azeotropic point is set too high, the amount of scattered $H_2SO_4$ is increased, bringing about an unfavorable situation. The increase of the azeotropic point means a reduction in the $H_2O$ content. Considering that the removing of the SiN film is carried out mainly by high-temperature $H_2O$, the etching of the SiN film by $H_2O$ may be suppressed. Thus, the $H_2O$ content should preferably be set in the range of about 10 wt % to 40 wt %. More preferably, the mixing ratio of $H_2SO_4$ and $H_2O$ should be set at about 70 wt %: 30 wt %, and the removing of the SiN film should be carried out at the azeotropic temperature of 160° C.

On the other hand, the inventors of the present application found the dependence of an etching rate on a stirring rate in the etching carried out by using the mixed solution of $H_2SO_4$ and $H_2O$. In other words, the stirring of the etching solution can increase the substitution efficiency of the etching solution, and the etching rate of the SiN film.

Figure 14:
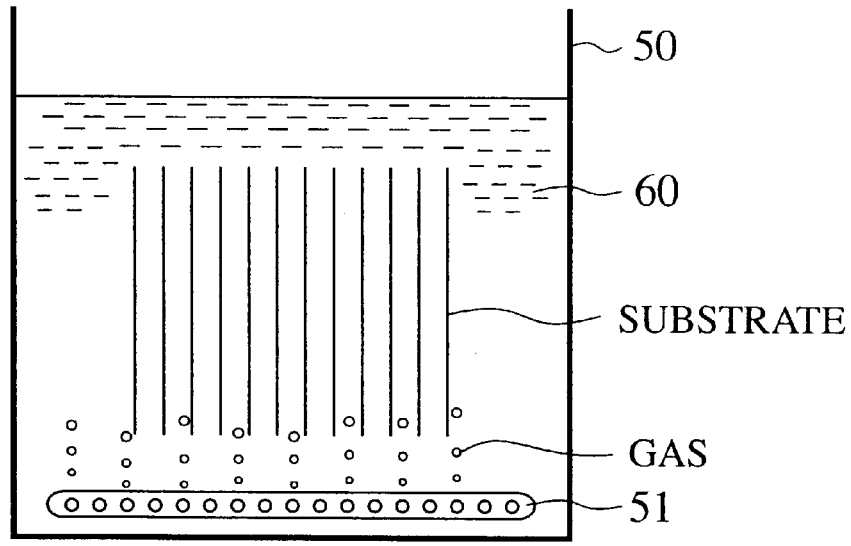
FIG. 14 is an apparatus view showing a constitutional example of an etching tank equipped with a stirring function in the fourth embodiment of the present invention.

In the case of batch processing, a tank provided with a stirring function or a circulating function may be used. In the case of single wafer processing, a similar advantage can be obtained by increasing the rotational speed of a wafer FIG. 14 is a view schematically showing the constitutional example of an etching tank provided with a stirring function in the case of batch processing. As shown in FIG. 14, a bubbler 51 is provided in an etching tank 50, and gas such as nitrogen gas, oxygen gas, or air is subjected to bubbling in etching solution 60. Also in this way, a high etching solution substitution advantage can be obtained by the effective stirring of the etching solution. In addition, other than the above, a method of applying ultrasonic vibration to the etching solution enables an etching rate to be increased by highly effective stirring. Note that an ejector as an apparatus for mixing gas with a solution may also be used.

Under the azeotropic condition, the condition itself provides a stirring effect. However, in the case of adding forcible stirring, a high etching rate can be obtained even in a non-azeotropic state.

Note that the removing process (etching process) of the SiON film formed by a CVD method is performed by use of the above etching method according to the fourth embodiment.

(Fifth Embodiment)

Next, description will be made for the removing process of the SiN film according to the fifth embodiment, which is similar to that of the fourth embodiment shown in FIGS. 11A and 11B.

Figure 15:
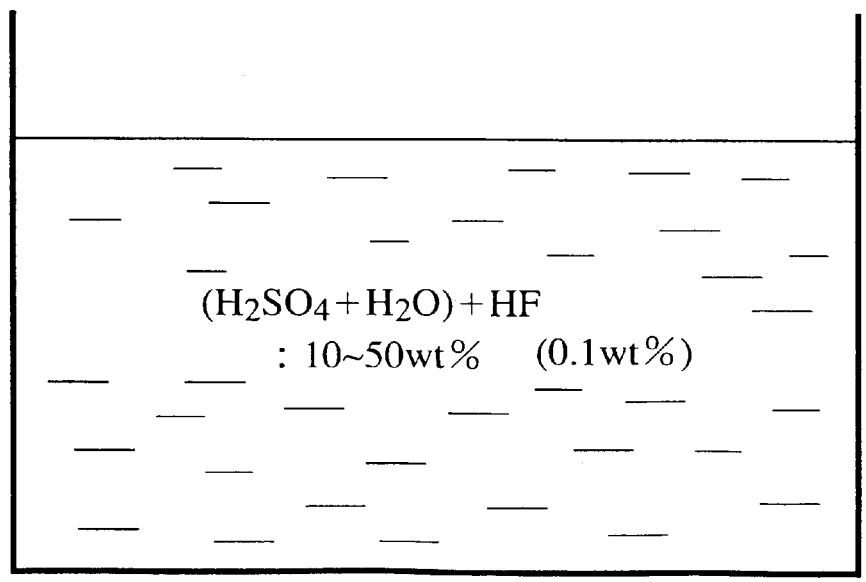
FIG. 15 is a view showing a composition of an etching solution used for the fifth embodiment of the present invention.

FIG. 15 shows composition of an etching solution used in the removing process of the SiN film according to the fifth embodiment. This etching solution is obtained by adding a small amount of HF to the mixed solution of $H_2SO_4$ and $H_2O$ of the fourth embodiment, having composition similar to that of the undiluted etching solution shown in the foregoing FIG. 2. This etching solution is specifically obtained by diluting commercial sulfuric acid with $H_2O$ to prepare a sulfuric acid solution of about 50 wt % to 90 wt %, and then adding a small amount of hydrofluoric acid (HF) to set the amount to 0.1 wt % or lower.

As described above with reference to the fourth embodiment, the inventors of the present application found the possibility of using the mixed solution (sulfuric acid aqueous solution) of $H_2SO_4$ and $H_2O$ as the etching solution instead of the conventional etching solution (phosphoric acid aqueous solution) of $H_3PO_4$ in the SiN film removing process.

Figures 16, 17:
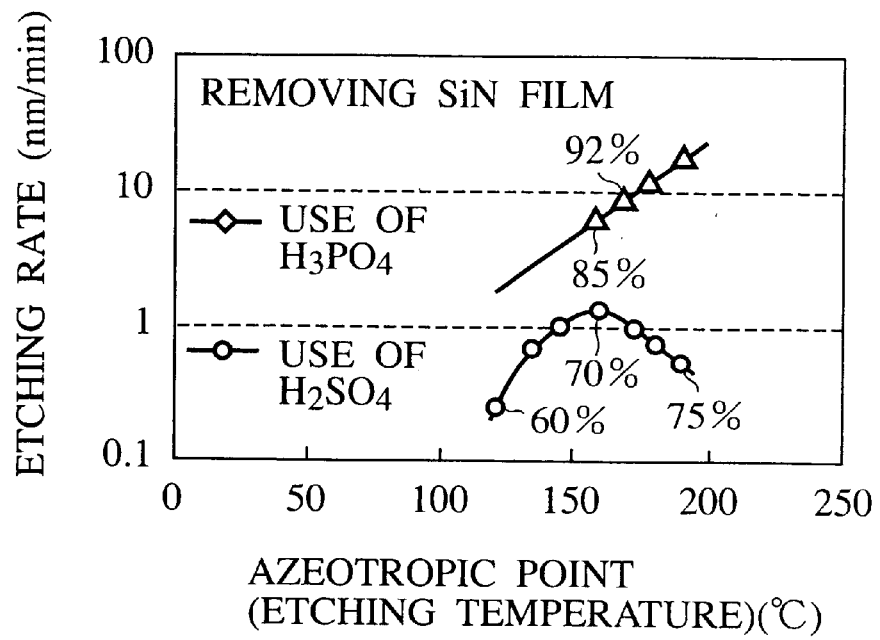
FIG. 16 is a graph showing a comparison of an etching rate when the etching solution of the fourth embodiment of the present invention is used with that of using a conventional etching solution.
FIG. 17 is a table showing a result of XPS-Si2P spectral analysis of an SiN film surface etched by using the etching solution of the fourth embodiment of the present invention.

However, as shown in FIG. 16, the etching solution using $H_2SO_4$ has an etching rate lower than that of the etching solution using the conventional $H_3PO_4$. Note that the etching rate shown in FIG. 16 is values when the etching of the SiN film is carried out at an azeotropic point temperature. In the case of using $H_3PO_4$, the etching rate is increased together with the increase of the azeotropic point temperature (etching temperature). In the case of using $H_2SO_4$, the etching rate is increased together with the increase of the azeotropic point temperature while the etching temperature is in the range of 140° C. ($H_2SO_4$ concentration: 60 wt %) to 160° C. ($H_2SO_4$ concentration: 70 wt %). However, after the $H_2SO_4$ reaches a peak concentration of about 70 wt %, the etching rate is lowered together with the temperature at higher temperatures than the peak.

To investigate the cause of such a lowered etching rate, the inventors of the present application analyzed the surface of the SiN film by XPS after the partial etching of the SiN film. The result of the analysis is shown in FIG. 17. Specifically, spectral analysis of Si2p was carried out.

The surface of the SiN film after partially etching by the etching solution using $H_3PO_4$ was substantially similar in the result to the surface of the SiN film after partially etching by only HF (reference), hardly oxidized.

On the other hand, the surface of the SiN film after partially etching by the etching solution using $H_2SO_4$ has increased peak intensity indicating Si—O coupling as the etching temperature and the $H_2SO_4$ concentration were increased. As a result, it can be considered that in the case of removing the SiN film by using $H_2SO_4$, the strong oxidizing force of sulfuric acid forms an oxide film on the surface of the SiN film, and this oxide film interferes with the etching of the SiN film.

Thus, the inventors of the present application examined a solution obtained by adding HF for removing the oxide film formed on the surface of the SiN film, to the etching solution of the fourth embodiment, i.e., the sulfuric acid aqueous solution.

FIG. 18 is a table showing a relation between an HF added concentration and the etching rate of the SiN film, and the etching selective rate of the SiN film with respect to an SiO film. Note that, as a base etching solution, the mixed solution of $H_2SO_4$ of 70 wt % and $H_2O$ of 30 wt % was used. As shown in the table of FIG. 18, when the HF added concentration is very low, about 0.02 wt %, the etching selective rate of the SiN film and the $SiO_2$ film is very high. In the case of using the conventional etching solution (sulfuric acid aqueous solution), the etching selective rate of the SiN film and the $SiO_2$ film is about 30 to 40. Accordingly, when the HF added concentration is low, the SiN film can be etched by a very high selective rate compared with that of the conventional etching solution.

However, if the HF added concentration is too low, the effect of HF addition is reduced, lowering the etching rate of SiN. In particular, when the HF added concentration is 0.002 wt %, the etching rate of SiN is about 3 nm/min., which is about half of 6 nm/min. of normal $H_3PO_4$. Therefore, considering the etching rate and the selective rate, the HF added concentration should preferably set to 0.1 wt % or lower, more preferably in the range of 0.1 wt % to 0.002 wt %.

In the case of using the HF-added etching solution of the fifth embodiment, even at a relatively low etching temperature of 140° C., the etching rate of the SiN film is 5 nm/min. or higher, and the etching selective rate is 50 or higher. Accordingly, etching should preferably be carried out at 140° C. or higher when an SiN film thickness is relatively thick. However, when an SiN film thickness is relatively thin, the etching temperature can be lowered to about 100° C.

The etching temperature can be increased up to 330° C., which is a boiling point of $H_2SO_4$. Considering the conditions of hardware such as the etching apparatus or the like, about 180° C. may be a limit. As the higher the etching temperature is, the more the water content in the etching solution is reduced, the oxidizing force of $H_2SO_4$ is relatively increased. Consequently, the too high etching temperature lowers the etching rate. Thus, the etching temperature should preferably be set within the range of 100° C. to 180° C., more preferably within the range of 140° C. to 160° C.

When an azeotropic point is 160° C., the etching solution can contain about 30 wt % of water. At the azeotropic point of 140° C., the water content of the etching solution is about 40 wt %. To always maintain a constant ratio of $H_2SO_4$ and $H_2O$ in the etching solution, only water needs to be added to always maintain the constant temperature by using the azeotropic point of the mixed solution of sulfuric acid and water. This can be achieved by using a general method.

In addition, when the etching temperature is set at 160° C., HF in the etching solution is easily scattered in a vapor phase, gradually reducing the HF concentration. Consequently, after 1 hour, the HF concentration is almost 0. In other words, when the SiN film is etched, an etching rate is the highest at the beginning of etching, and then gradually lowered. Thus, almost no etching may progress in the latter half of the etching process. By utilizing such a phenomenon, it is possible to automatically control a thickness of a film to be etched. For example, by setting the HF concentration and the etching temperature enough to make it possible to remove all of the thickness of the SiN film to be etched, it is possible to carry out etching without any over-etching even in rough time management.

The addition of HF into the etching solution can be carried out a plurality of times during etching. In this case, by using a ternary concentration monitor of $H_2O$—$H_2SO_4$-HF (monitor using conductivity and sonic velocity), irrespective of passage time, etching can be carried out while controlling the HF and water so as to always have the same concentration.

For example, HF of 0.1 wt % or more may be added beforehand by considering the concentration of HF scattered into a vapor phase during the temperature increase of the etching solution. Lastly, at the beginning of etching, adjustment may be made to set the concentration to 0.1 wt %.

Further, HF in the etching solution can be introduced by dissolution of HF gas, the addition of a commercial HF solution or the like. Moreover, instead of HF, a solution obtained by dissolving the crystals of ammonium fluoride ($NH_4F$) and ammonium hydrogen fluoride ($NH_4F \cdot HF$), or a solution obtained by adding an aqueous solution such as an ammonium fluoride solution, a buffered hydrofluoric acid solution or the like may be used.

Furthermore, the etching solution for removing SiN film of the foregoing fifth embodiment has composition similar to that of the etching solution used in the etching process of each of the first to third embodiments. Accordingly, an apparatus similar to the etching apparatus used for the first to third embodiments can be used. Also, waste solution disposal can be carried out in common. Therefore, chemical costs can be reduced, process efficiency can be increased, and the number of apparatuses and a space for a device can be reduced. As a result, it is possible to greatly reduce production costs.

Note that the removing process (etching process) of the SiON film formed by a CVD method is performed by use of the above etching method according to the fifth embodiment.

(Etching Apparatus)

Figure 19:
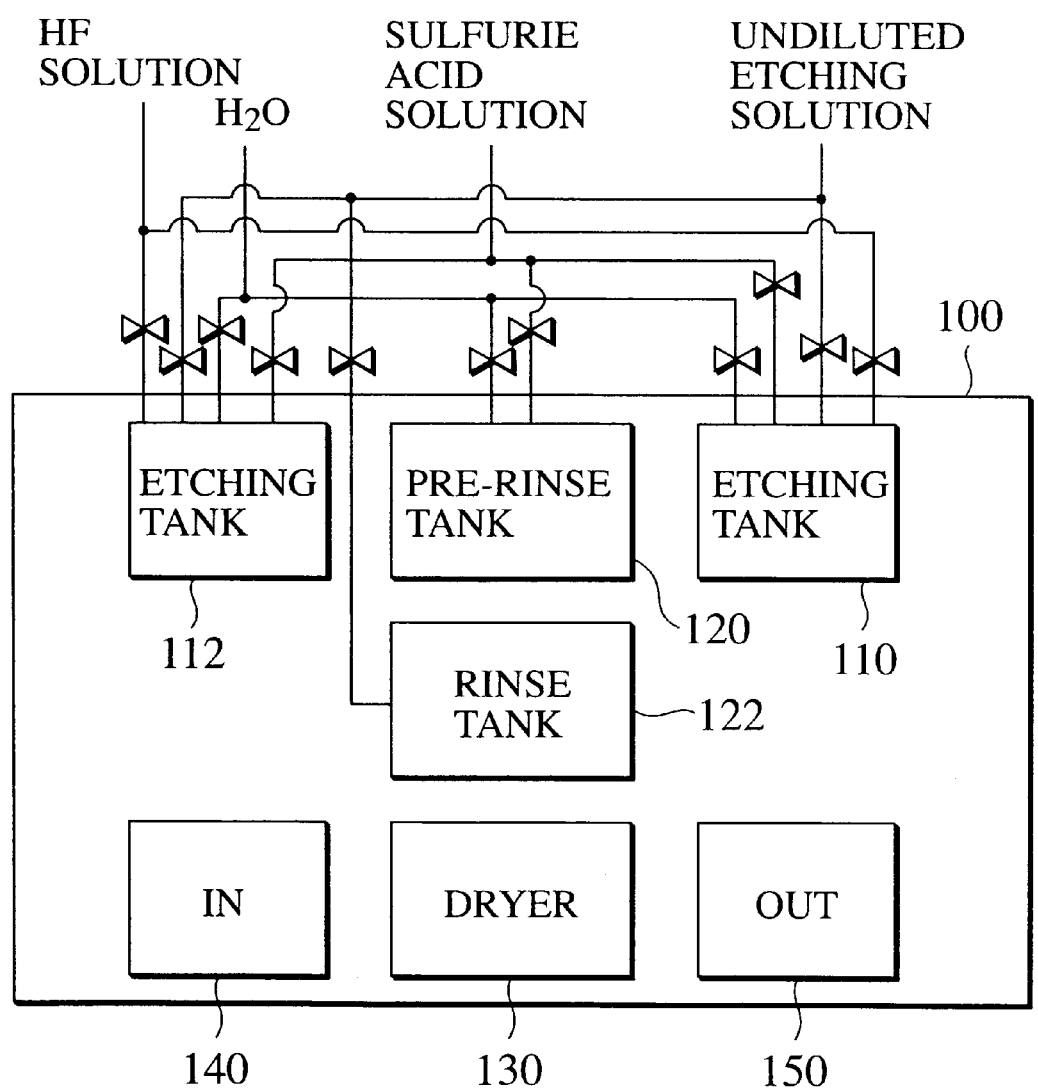
FIG. 19 is an apparatus constitutional view showing an etching apparatus example used for etching of each of the first to fifth embodiments.

FIG. 19 shows a constitutional example of an etching apparatus to be used in common in etching processes of the first to fifth embodiments.

An etching apparatus 100 includes three or four solution supply lines: the first line has been prepared for the undiluted etching solution of the embodiments; the second line for a sulfuric acid solution ($H_2O$ content is 5 wt % or lower); the third line for pure water ($H_2O$); and the fourth line for a hydrofluoric acid (HF) solution.

In the etching apparatus 100, at least one or more of etching tanks 110 and 112, a pre-rinse tank 120, and a rinse tank 122 are provided. For example, as shown in FIG. 19, the etching tanks 110 and 112 are disposed in both sides sandwiching the pre-rinse tank 120. The rinse tank 122 is disposed before the pre-rinse tank 120, and a dryer 130 is disposed before the rinse tank 122. A substrate carrying-in room (IN) 140 and a substrate carrying-out room (OUT) 150 are disposed in the left and right sides of the dryer. Note that the etching tanks 110 and 112 should preferably be provided with heaters so as to enable an etching solution temperature to be adjusted.

The supply line of the undiluted etching solution is connected to the etching tanks 112 and 110; the supply line of the sulfuric acid solution to the etching tanks 110 and 112 and the pre-rinse tank 120; and the supply line of the pure water to the etching tanks 110 and 112, the pre-rinse tank 120, and the rinse tank 122. Each connection includes an opening/closing valve, making it possible to adjust the amount of the solution introduced into each tank.

With such a piping constitution, the etching solution used in each embodiment can be introduced into each etching tank. Note that the number of etching tanks can be increased as occasion demands.

For example, in the case of batch processing, while a plurality of substrates are housed in a predetermined substrate cassette having etching resistance, the substrates kept in the cassette are carried from the IN 140 as a carrying-in room to the first etching tank 112 together with the cassette and dipped in the etching solution in the tank. After the passage of predetermined time, the substrates kept in the cassette are pulled up from the etching solution, carried to the pre-rinse tank 120, dipped in the sulfuric acid solution in the tank 120, and preliminary cleaning is carried out. The substrates are further subjected to cleaning by flowing water in the rinse tank 122 containing pure water. After sufficient cleaning, the substrates are transferred to the dryer 130, and dried. After drying, the substrates are transferred to the substrate carrying-out room OUT 150, and a series of etching processes is finished.

In the case of the selective or unselective etching of the insulating film of the first or second embodiment, where the $H_2O$ content is an important factor for the etching rate, if the substrate pulled up from the etching solution is directly dipped in the pure water in the rinse tank 122, steep increase of the $H_2O$ concentration may enhance etching. Thus, excessive etching by $H_2O$ should preferably be prevented by first transferring the substrate to the pre-rinse tank 120 after the etching, subjecting the substrate to preliminary cleaning in the sulfuric acid solution having a small water content in the tank 120 to remove HF and $NH_4F$ components, finishing the etching, and then subjecting the substrate to pure water cleaning in the rinse tank 122.

Note that the pre-rinse solution to be used in this case is not limited to the sulfuric acid solution. By supplying an alkali solution such as choline or the like, etching can be stopped more effectively. In addition, particles can be simultaneously removed by alkali.

As described above, since for the etching solution used in the embodiments, the same undiluted etching solution or the solution having similar composition can be used in the plurality of etching processes, the etching apparatus can be shared. Therefore, it is possible to greatly reduce etching apparatus costs, and the area occupied by the etching apparatus in the clean room as a limited space.

The foregoing etching apparatus can be similarly used for the undiluted etching solution, which is prepared by dissolving ammonium hydrogen fluoride ($NH_4F \cdot HF$) or single hydrogen fluoride (HF) gas in the sulfuric acid solution.

The etching solution, the etching method, and the like, of the present invention have been described by way of embodiments. However, the present invention is not limited to such embodiments. As apparent to those skilled in the art, changes can be made for etching temperature conditions, types of insulating films as materials to be etched, and the like. Moreover, the film constitution on the substrate when selective or unselective etching is carried out is not limited to the example shown in each of the embodiments.

According to method of manufacture of the semiconductor device of the present invention, the steps of selective etching and unselective etching for an insulating film, and removing residual reaction products by dry etching can be performed highly accurately by using a common undiluted etching solution or an etching solution having similar composition. Thus, the dedicated etching apparatus conventionally necessary for each etching process can be shared, making it possible to greatly reduce apparatus costs and the area occupied by the etching apparatus in the clean room. Moreover, since the types of chemicals to be used can be reduced, and only inorganic acid is enough for the constitution, it is possible to reduce a burden of chemical management and a burden of waste solution disposal.

What is claimed is:

1. A method of manufacture of semiconductor devices, comprising:
    etching carried out by using a solution containing $H_2SO_4$ and $NH_4F$, or $H_2SO_4$ and HF, as main components, and having an $H_2O$ content in the solution set to 5 wt % or lower as an undiluted etching solution.

2. The method according to claim 1, wherein the solution is prepared by dissolving a solid material having one selected from HF composition and $NH_4F$ composition in a sulfuric acid solution.

3. The method according to claim 2, wherein the solid material is one selected from ammonium fluoride and ammonium hydrogen fluoride.

4. The method according to claim 2, wherein the solid material is ammonium fluoride, and the solution is prepared by dissolving the ammonium fluoride of 0.1 to 20 mol/liter in the sulfuric acid solution.

5. The method according to claim 2, wherein the sulfuric acid solution has the $H_2O$ content set to 5 wt % or lower.

6. The method according to claim 1, wherein the solution is prepared by dissolving one selected from mono HF gas and hydrofluoric acid anhydride in a sulfuric acid solution.

7. The method according to claim 6, wherein the sulfuric acid has the $H_2O$ content set to 5 wt % or lower.

8. The method according to claim 1, wherein the undiluted etching solution is diluted with a sulfuric acid solution having an $H_2O$ content set to 5 wt % or lower, and then used as an etching solution.

9. The method according to claim 1, wherein the etching is a selective etching a specific one or a plurality of insulating films among a plurality of films different from one another in a property, and exposed to a surface of a semiconductor substrate, with respect to another film.

10. The method according to claim 9, wherein the specific one or the plurality of insulating films include one or ones selected from the group consisting of a BSG film, a PSG film, a BPSG film, a TEOS film formed by a low pressure CVD method and an SiON film formed by a CVD method, and the other films include ones selected from the group consisting of a thermal oxide $SiO_2$ film, an SiN film, an SiON film, an Si film, a metal film and a TEOS film formed by a plasma CVD method.

11. The method according to claim 1, wherein the etching is an unselective etching two or more insulating films among a plurality of films different from one another in a property, and exposed to a surface of a semiconductor substrate.

12. The method according to claim 11, wherein the two or more insulating films are a thermal oxide $SiO_2$ film and an SiN film.

13. The method according to claim 1, wherein the etching is a selective etching residual reaction products left on a surface of a semiconductor substrate after dry etching.

14. A method of manufacture of semiconductor devices, comprising:
    selective etching carried out for one of an SiN film and an SiON film formed by a CVD method with respect to one selected from an $SiO_2$ film, an Si substrate, and an Si film at an etching solution temperature of 150° C. or higher, by using a mixed solution of $H_2SO_4$ and $H_2O$ having an $H_2O$ content set at 10 wt % to 40 wt % with respect to the $H_2SO_4$ as an etching solution.

15. The method according to claim 14, wherein the mixed solution is stirred during the etching.

16. A method of manufacture of semiconductor devices, comprising:
    selective etching carried out for one of an SiN film and an SiON film formed by a CVD method with respect to one selected from an $SiO_2$ film, an Si substrate, and an Si film at an azeotropic point temperature, by using a solution obtained by adding HF of 0.1 wt % or lower to a mixed solution of $H_2SO_4$ and $H_2O$ having an azeotropic point set at 100° C. or higher as an etching solution.

17. A method of manufacture of semiconductor devices, comprising:

selective etching carried out for one of an SiN film and an SiON film formed by a CVD method with respect to one selected from an $SiO_2$ film, an Si substrate, and an Si film at an etching solution temperature of 100° C. or higher, by using a solution obtained by adding HF of 0.1 wt % or lower to a mixed solution of $H_2SO_4$ and $H_2O$ having an $H_2O$ content set at 10 wt % to 50 wt % with respect to the $H_2SO_4$ as an etching solution.

18. The method according to claim 17, wherein the mixed solution is stirred during the etching.

19. A method of manufacture of semiconductor devices, comprising:

selective etching a specific one or a plurality of insulating films among a plurality of films different from one another in a property and exposed to a surface of a semiconductor substrate, with respect to another film, by using an undiluted etching solution or a solution obtained by diluting the undiluted etching solution with a sulfuric acid solution having an $H_2O$ content set at 5 wt % or lower, as a first etching solution, the undiluted etching solution containing $H_2SO_4$ and $NH_4F$ or containing $H_2SO_4$ and HF, as main components, and has an $H_2O$ content set to 5 wt % or lower;

selective etching a specific one or a plurality of insulating films among a plurality of films different from one another in a property and exposed to the surface of the semiconductor substrate, by using the undiluted etching solution or a solution obtained by diluting the undiluted etching solution with the sulfuric acid solution having the $H_2O$ content set at 5 wt % or lower, as a second etching solution; and unselective etching a plurality of insulating films exposed to the surface of the semiconductor substrate, by using the undiluted etching solution, or a solution obtained by diluting the undiluted etching solution with the sulfuric acid solution having the $H_2O$ content set at 5 wt % or lower, as a third etching solution.

20. The method according to claim 19, further comprising:

selective etching residual reaction products left on the surface of the semiconductor substrate after dry etching, by using the undiluted etching solution or a solution obtained by diluting the undiluted etching solution with the sulfuric acid solution having the $H_2O$ content set at 5 wt % or lower as a fourth etching solution.

21. The method according to claim 19, further comprising:

selective etching an SiN film or an SiON film formed by a CVD method, exposed to the surface of the semiconductor substrate at an azeotropic point temperature by using a mixed solution of $H_2SO_4$ and $H_2O$ having an azeotropic point set at 150° C. or higher azeotropic point temperature as the etching solution, or at a temperature of 150° C. or higher by using a mixed solution of $H_2SO_4$ and $H_2O$ having the $H_2O$ content set at 10 wt % to 40 wt % with respect to the $H_2SO_4$ as the etching solution.

22. The method of according to claim 19, further comprising:

selective etching an SiN film or an SiON film formed by a CVD method exposed to the surface of the semiconductor substrate at an azeotropic point temperature by using a solution obtained by adding HF of 0.1 wt % or lower to a mixed solution of $H_2SO_4$ and $H_2O$ having an azeotropic point set at 100° C. or higher as the etching solution, or at a temperature of 100° C. or higher by using a solution obtained by adding HF of 0.1 wt % or lower to a mixed solution of $H_2SO_4$ and $H_2O$ having the $H_2O$ content set at 10 wt % to 50 wt % with respect to the $H_2SO_4$.

23. A method of manufacture of semiconductor devices, comprising:

etching an insulating film exposed to a surface of a semiconductor substrate, by using an undiluted etching solution containing $H_2SO_4$ and $NH_4F$, or $H_2SO_4$ and HF as main components, and having an $H_2O$ content set to 5 wt % or lower, or by using a solution obtained by diluting the undiluted etching solution with a sulfuric acid solution having an $H_2O$ content set at 5 wt % or lower, as an etching solution;

subjecting the surface of the semiconductor substrate after the etching to preliminary cleaning by a sulfuric acid solution having an $H_2O$ content set at 5 wt % or lower; and subjecting the surface of the semiconductor substrate after the preliminary cleaning to real cleaning by pure water.

* * * * *